United States Patent
Yanagi

(10) Patent No.: US 9,663,853 B2
(45) Date of Patent: May 30, 2017

(54) VACUUM VAPOR DEPOSITION APPARATUS

(75) Inventor: Yuji Yanagi, Minato-ku (JP)

(73) Assignee: MITSUBISHI HEAVY INDUSTRIES, LTD., Tokyo (JP)

(*) Notice: Subject to any disclaimer, the term of this patent is extended or adjusted under 35 U.S.C. 154(b) by 1172 days.

(21) Appl. No.: 12/816,465

(22) Filed: Jun. 16, 2010

(65) Prior Publication Data

US 2011/0000430 A1 Jan. 6, 2011

(30) Foreign Application Priority Data

Jul. 2, 2009 (JP) .................. 2009-157505

(51) Int. Cl.
*C23C 16/00* (2006.01)
*C23C 14/24* (2006.01)
*C23C 14/12* (2006.01)

(52) U.S. Cl.
CPC ............ *C23C 14/243* (2013.01); *C23C 14/12* (2013.01)

(58) Field of Classification Search
CPC ........ C23C 14/24; C23C 14/243; C23C 14/26
USPC .................................................. 118/726, 727
See application file for complete search history.

(56) References Cited

U.S. PATENT DOCUMENTS

| | | | |
|---|---|---|---|
| 6,237,529 B1 | 5/2001 | Spahn | |
| 7,339,139 B2 * | 3/2008 | Yang et al. | 219/426 |
| 2001/0005553 A1 * | 6/2001 | Witzman et al. | 428/402 |
| 2003/0015140 A1 * | 1/2003 | Van Slyke et al. | 118/723 VE |
| 2003/0101937 A1 | 6/2003 | Van Slyke et al. | |
| 2004/0123804 A1 * | 7/2004 | Yamazaki et al. | 118/723 VE |
| 2005/0034810 A1 * | 2/2005 | Yamazaki et al. | 156/345.3 |
| 2005/0126493 A1 * | 6/2005 | Jeong | 118/726 |
| 2007/0134405 A1 * | 6/2007 | Otsuka et al. | 427/64 |
| 2007/0204798 A1 | 9/2007 | Iwasaki et al. | |
| 2008/0115729 A1 * | 5/2008 | Oda et al. | 118/726 |
| 2009/0061090 A1 * | 3/2009 | Negishi | 427/255.28 |

FOREIGN PATENT DOCUMENTS

| | | |
|---|---|---|
| EP | 1 316 625 | 6/2003 |
| JP | 55-125269 | 9/1980 |
| JP | 5-139882 | 6/1993 |

(Continued)

OTHER PUBLICATIONS

English translation of KR 2009-0047953, Ahn, May 2009.*

(Continued)

*Primary Examiner* — Keath Chen
(74) *Attorney, Agent, or Firm* — Wenderoth, Lind & Ponack, L.L.P.

(57) ABSTRACT

A vacuum vapor deposition apparatus includes a vaporization container which has a plurality of equally-diametered release holes arranged linearly and in which the release holes are arranged densely on both end portion sides of the vaporization container. The vaporization container includes therein a current plate having a plurality of equally-diametered passage holes through which vapor of a vaporization material passes. The passage holes are arranged densely on both end portion sides in such a manner that, as conductance per unit length in the arrangement direction of the release holes, conductance by the passage holes is proportional to conductance by the release holes.

10 Claims, 9 Drawing Sheets

(56) References Cited

FOREIGN PATENT DOCUMENTS

KR  10-2009-0047953  5/2009
WO  2006/057021    6/2006

OTHER PUBLICATIONS

Korean Office Action issued Mar. 16, 2012 in corresponding Korean Patent Application No. 10-2010-0059985 with English translation.
European Search Report dated Sep. 23, 2010 in corresponding European Application No. 10167322.6.

* cited by examiner

VACUUM VAPOR DEPOSITION APPARATUS

TECHNICAL FIELD

The present invention relates to a vacuum vapor deposition apparatus which forms a thin film by depositing multiple vaporization materials simultaneously on a deposition target such as a substrate.

BACKGROUND ART

A vacuum vapor deposition apparatus is an apparatus for forming a thin film as follows. First, a deposition target and a vaporization container containing a vaporization material are placed inside a vacuum chamber in the apparatus. Then, while the inside of the vacuum chamber is depressurized, the vaporization container is heated to melt and vaporize the vaporization material through evaporation or sublimation. The vaporized material is then deposited on a surface of the deposition target to thereby form a thin film. As a method of heating the vaporization container, the vacuum vapor deposition apparatus employs methods such as an external heating method using an external heater to heat the vaporization container containing the vaporization material. In recent years, vacuum vapor deposition apparatuses have been used not only to form metal thin films and oxide thin films using metal materials, but also to form organic thin films by depositing organic materials, as well as to form small molecular organic thin films by co-deposition of multiple organic materials. For example, vacuum vapor deposition apparatuses are used to form organic electroluminescent elements (hereinafter, referred to as organic EL elements) for flat panel displays.

CITATION LIST

Patent Literatures

{Patent Literature 1} Japanese Patent Application Publication No. 2004-095275
{Patent Literature 2} Japanese Patent Application Publication No. 2004-137583
{Patent Literature 3} Japanese Patent Application Publication No. 2004-232090

SUMMARY OF INVENTION

Technical Problem

As the screen sizes of flat panel displays such as liquid crystal displays increase, the substrates used therefore also increase in size. Similarly, larger substrates are desired for organic EL elements, which are also applicable to displays and illuminations. In an organic EL display, thin films need to be deposited uniformly on a substrate. However, the larger the substrates become, the more difficult it becomes to form uniform thin films since variation more easily occurs in film thickness. There have been increasing demands for higher panel qualities particularly in recent years, requiring higher uniformity in film thickness.

To form a uniform thin film, a conventional vacuum vapor deposition apparatus described for example in Patent Literature 1 includes a vaporization source that vaporizes a material and lets the vaporized material through multiple openings arranged in a line. The pitches of the openings are made smaller on end sides of the vaporization source. Moreover, heating temperature is controlled by providing multiple temperature control means separately in the longitudinal direction of the line of the openings and detecting a film thickness (vaporization rate) individually for each separate region. Additionally, in Patent Literature 2, there is provided a vaporization source including stacked frames serving as a heater and a vaporization flow controller. At the most upstream position of the vaporization flow controller, there is provided a uniformizing layer including a distributing plate having multiple guide projections and multiple openings formed between the guide projections. Moreover, in Patent Literature 3, one or more opening portions are formed in an elongated container, in which to fill a vaporization material, in the longitudinal direction thereof. Then, conductance of each opening portion is made smaller than conductance of the container in the longitudinal direction thereof. There is also a method of improving the film thickness distribution by making a vaporization source longer than a substrate which is a deposition target.

According to these conventional vacuum vapor deposition apparatuses, a relatively uniform film is formed by relatively moving a large substrate and vaporization source to perform deposition on the substrate. However, depending on the vaporization material, the vaporization state may change to a large extent due to a slight variation in temperature of the vaporization source or a slight change in state of the vaporization material inside the vaporization container. In such case, the vaporization amount of the vaporization material in the longitudinal direction changes, which in turn changes the film thickness distribution on the substrate and thereby causes a problem of changing element properties. Likewise, when the vaporization material decreases in amount along with consumption thereof, the vaporization material may be left unevenly, which in turn changes the vaporization amount of the vaporization material in the longitudinal direction. Thus, the film thickness distribution on the substrate changes thereby causing a problem of changing element properties.

In addition, to make the vaporization source longer than the substrate causes not only the problem described above but also a reduction in utilization of the vaporization material (a ratio of the vaporization material adhering to the substrate after being vaporized from the vaporization source), resulting in high consumption of the vaporization material. This causes a problem of increasing manufacturing cost when the vaporization material is expensive (e.g., an organic material for an organic EL element, or the like).

The present invention has been made in view the above circumstances, and has an object to provide a vacuum vapor deposition apparatus capable of improving the uniformity of the film thickness distribution of a thin film deposited on a large substrate. Specifically, the present invention aims to improve the uniformity without lowering the utilization of a vaporization material even when variation in temperature and/or unevenness in the vaporization material occur in a linear-shaped vaporization container.

Solution to Problem

A vacuum vapor deposition apparatus according to a first feature of the present invention for solving the above problem includes a vaporization container that has a plurality of release holes arranged linearly and that has larger conductance by the release holes on both end portion sides. The vaporization container is heated to evaporate or sublimate a vaporization material contained therein, and vapor of the vaporization material is released through the plurality of release holes. Then, the vaporization material is deposited on an entire surface of a substrate by relatively moving the substrate and the vaporization container in a direction perpendicular to an arrangement direction of the plurality of release holes. The apparatus is characterized in that the vaporization container includes therein a current plate which directly faces the vaporization material, the current plate having a plurality of passage holes through which the vapor passes, and as conductance per unit length in the arrangement direction of the plurality of release holes, conductance by the passage holes is made proportional to conductance by the release holes.

A vacuum vapor deposition apparatus according to a second feature of the present invention for solving the above problem provides the vapor deposition apparatus described in the first feature of the present invention. The apparatus is characterized in that conductance by the release holes on both end portion sides of the vaporization container is made larger by causing all the release holes to have an equal area and arranging the release holes densely on both end portion sides of the vaporization container, or by arranging the plurality of release holes at an equal interval and causing the release holes on the both end portion sides of the vaporization container to have larger areas.

A vacuum vapor deposition apparatus according to a third feature of the present invention for solving the above problem provides the vapor deposition apparatus described in the first feature of the present invention. The apparatus is characterized in that conductance by the passage holes is made proportional to conductance of the release holes by causing all the passage holes to have an equal area and arranging the passage holes densely on both end portion sides of the vaporization container, or by arranging the plurality of passage holes at an equal interval and causing the passage holes on both end portion sides of the vaporization container to have larger areas.

A vacuum vapor deposition apparatus according to a fourth feature of the present invention for solving the above problem provides the vapor deposition apparatus described in the first feature of the present invention. The apparatus is characterized in that a ratio [C2/C1] of conductance C2 by the passage holes to conductance C1 by the release holes is set at 5.0 or less, and preferably 2.0 or less.

A vacuum vapor deposition apparatus according to a fifth feature of the present invention for solving the above problem provides the vapor deposition apparatus described in the first feature of the present invention. The apparatus is characterized in that a ratio [H2/H1] of a distance H2 from the release holes to the current plate to a height H1 of an inside of the vaporization container is set at 0.6 or less, and preferably 0.5 or less.

A vacuum vapor deposition apparatus according to a sixth feature of the present invention for solving the above problem provides the vapor deposition apparatus described in the first feature of the present invention. The apparatus is characterized in that the passage holes are arranged in such a manner that the release holes and the passage holes are not aligned colinearly when viewed from the entire surface of the vaporization material.

A vacuum vapor deposition apparatus according to a seventh feature of the present invention for solving the above problem provides the vapor deposition apparatus described in the first feature of the present invention. The apparatus is characterized in that heating means for heating the vaporization container is configured of one heater wound in spirals around an outer surface of the vaporization container and one heating power source feeding the heater with power. Meanwhile, control means for controlling the heating power source is configured of one vaporization rate detector detecting a vaporization rate of the vapor of the vaporization material, and one vaporization rate controller controlling an output to the heating power source on the basis of the vaporization rate detected by the vaporization rate detector, so that the vaporization rate of the vapor of the vaporization material remains constant.

A vacuum vapor deposition apparatus according to an eighth feature of the present invention for solving the above problem provides the vapor deposition apparatus described in the seventh feature of the present invention. The apparatus is characterized in that the heater is wound in such a manner that intervals thereof on the release holes side are denser than intervals thereof on the vaporization material side.

Advantageous Effects of Invention

According to the first to fifth features, the current plate having the multiple passage holes are provided in the linear vaporization container, and as conductance per unit length in the longitudinal direction, conductance by the passage holes is made proportional to conductance by the release holes. This allows control on the vapor distribution of the vaporization material in the longitudinal direction of the vaporization container (in the arrangement direction of the multiple release holes) even when the vaporization state of the vaporization material is changed in the vaporization container in the longitudinal direction due to a temperature variation or an unevenness of the vaporization material. Hence, a thin film having a more uniform film thickness distribution in the longitudinal direction can be achieved also for a large substrate. As a result, an element having uniform properties is formed.

According to the sixth feature, the release holes are arrange so as not to be aligned colinearly with passage holes when viewed from the entire surface of the vaporization material. This prevents vapor generated through bumping from adhering directly to the substrate. Thus, the product quality is significantly improved.

According to the seventh feature, the heating means and the control means of the vaporization container are formed as a single system. This makes it possible to control the vaporization rate easily and stably over a long period of time, thus allowing formation of a thin film having a uniform film thickness and thus formation of an element having stable properties.

According to the eighth feature, the heater is wound in such a manner that the intervals thereof are denser on the release holes side. This prevents temperature decrease in the release holes and thus prevents the release holes from being clogged by the vaporization material.

BRIEF DESCRIPTION OF DRAWINGS

FIG. 4A is a cross-sectional view of the vaporization container in its longitudinal direction. FIG. 4B is a top view of the vaporization container. FIG. 4C is a top view of a current plate inside the vaporization container.

DESCRIPTION OF EMBODIMENTS

Embodiments of a vacuum vapor deposition apparatus according to the present invention will be described in detail with reference to FIGS. 1 to 11.

First Example

Figure 1:
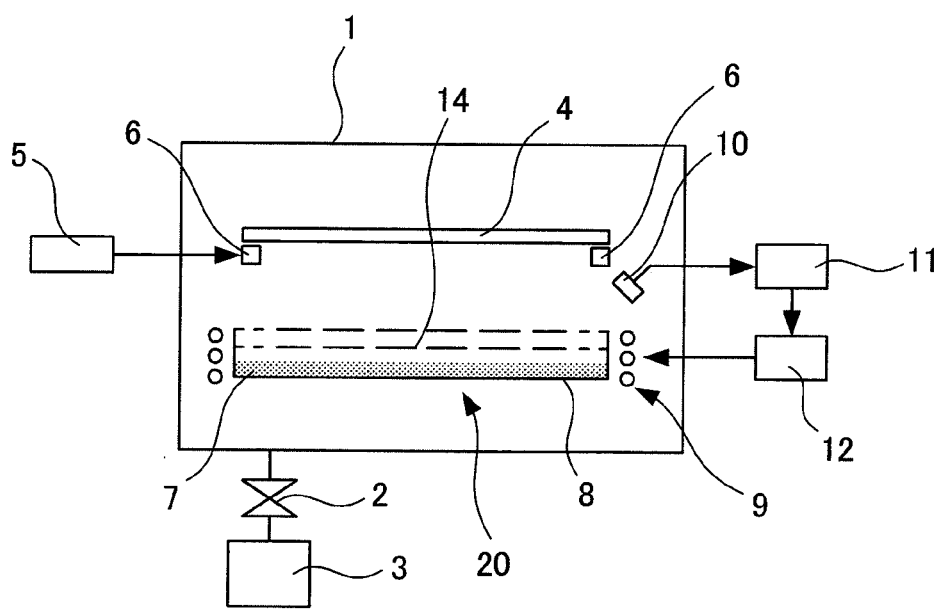
FIG. 1 is a schematic configuration diagram showing an exemplary embodiment of a vacuum vapor deposition apparatus according to the present invention.

FIG. 1 is a schematic configuration diagram showing the configuration of a vacuum vapor deposition apparatus of a first example. FIG. 1 shows a cross section taken along a plane perpendicular to the transport direction of a substrate in the vacuum vapor deposition apparatus. The vacuum vapor deposition apparatus of the first example is installed as a part (vacuum vapor deposition apparatus section) of an inline system for forming organic EL elements. Thus, the vacuum vapor deposition apparatus of the first example will be described below by taking formation of an organic EL element as an example; however, the vacuum vapor deposition apparatus of the first example is not limited to this, and is applicable to formation of a metal thin film of a metal material, an insulating thin film of an insulating material, and the like. The vacuum vapor deposition apparatus of the first example is also applicable to deposition using only one vaporization material as well as to deposition using multiple vaporization materials (co-deposition).

The inline system includes multiple processing apparatuses (e.g., a vacuum vapor deposition apparatus, and the like). The whole system is configured by a vacuum chamber through which multiple substrates are transported continuously, each substrate being subjected to successive processes for formation of organic EL elements (e.g., formation of luminescent layers as organic thin films, formation of electrodes as metal thin films, and the like). These processes require structures for carrying in the substrates from the atmosphere side to the vacuum chamber and for carrying out the substrates from the vacuum chamber, such as a charging chamber and a discharging chamber. These structures may be obtained by known techniques, and thus illustration thereof is omitted here.

In the vacuum vapor deposition apparatus for forming an organic thin film for an organic EL element, for example, a vacuum chamber 1 is connected to a vacuum pump 3 via a valve 2 as shown in FIG. 1, allowing the inside of the vacuum chamber 1 to be evacuated to a high vacuum state. A substrate 4 on which to deposit an organic thin film is positioned on the center of an unillustrated tray. With rotation of transport rollers 6 driven by a drive source 5, the substrate 4 is transported together with the tray from the front side toward the further side of FIG. 1. Note that in the first example, vaporization sources 20 to be described later are fixed at certain positions and the substrate 4 is caused to move; in contrast, the substrate 4 may be fixed at a certain position and the vaporization sources 20 may be caused to move.

Below a path of the substrate 4, arranged are the vaporization sources 20 each including a vaporization container 8 in which a vaporization material is contained, a heater for heating 9 placed around each vaporization container 8, and the like. Each vaporization source 20 is formed as a linear-shaped vaporization source elongated in the horizontal direction (hereinafter, referred to as a broad width direction of the substrate 4) perpendicular to the transport direction of the substrate 4, and has a length equal to or slightly greater than the length of the substrate 4 in the board width direction.

Above each vaporization container 8, provided is a vaporization rate detector 10 (e.g., crystal monitor head or the like) to detect the vaporization rate of the corresponding vaporization material 7 vaporized from the vaporization container 8. This vaporization rate detector 10 is connected to a vaporization rate controller 11. The vaporization rate controller 11 controls the control output to a heating power source 12 on the basis of the vaporization rate detected by the vaporization rate detector 10 so that the vaporization rate would remain at a predetermined value. The heating power source 12 feeds the heater 9 with the power controlled on the basis of the control output so that the vaporization rate would remain constant. Here, the control described above refers to control of temperature at the time of deposition. Meanwhile, in a case of controlling the temperature until the temperature of the vaporization container 8 reaches a vaporization temperature, i.e., control of temperature rising, the temperature is controlled by switching the control means for controlling the heating power source 12 to a thermocouple and a temperature controller (both unillustrated.) provided to a bottom portion of the vaporization container.

When each vaporization container 8 is heated using the vaporization rate detector 10, the vaporization rate controller 11, the heating power source 12, and the heater 9 as described above, the vaporization material 7 contained in the vaporization container 8 is evaporated or sublimated. The vapor of the vaporization material 7 is then released in accordance with a constant vaporization rate through multiple release holes 13 to be described later. The board width direction of the substrate 4 is the same as the direction in which the multiple release holes 13 are arranged. The substrate 4 and each vaporization source 20 are caused to relatively move in the direction perpendicular to the board width direction and the direction in which the release holes 13 are arranged. Hence, the vaporization materials 7 vaporized from the respective vaporization sources 20 are deposited on the entire surface of the substrate 4.

Next, a structure of the vaporization source 20 will be described in detail using FIGS. 2A to 4C.

Figure 2A:
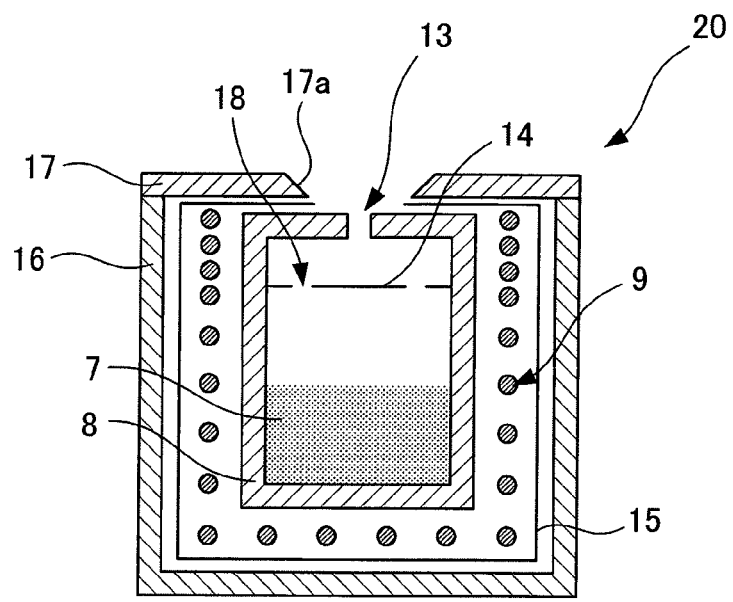
FIGS. 2A and 2B are cross-sectional views each showing an example of a linear-shaped vaporization source of the vacuum vapor deposition apparatus according to the present invention.

FIG. 2A is a cross-sectional view of the vaporization source of the first example, taken along a plane perpendicular to the longitudinal direction of the linear vaporization source.

The vaporization container 8 placed inside the vaporization source 20 is formed to be elongated in the board width direction of the substrate 4, and has a length equal to or slightly greater than the length of the substrate 4 in the board width direction. The multiple release holes 13 are provided in an upper surface (surface on the substrate 4 side) of the vaporization container 8. A current plate 14 having multiple passage holes 18 is placed between the release holes 13 and the vaporization material 7 inside the vaporization container 8. As will be explained using later-described FIGS. 4A to 4C, the positions of the release holes 13 and the passage holes 18 in the longitudinal direction are arranged in such a manner that the film thickness distribution of a thin film formed by deposition of the vaporization material 7 would be uniform in the board width direction of the substrate 4.

For installation and removal of the vaporization container 8 as well as for the arrangement of the release holes 13, the heater 9 is not placed above the vaporization container 8. Accordingly, in order to compensate temperature decrease in the release holes 13, the heater 9 is disposed densely on the release holes 13 side and the lower heater 9 is disposed sparsely on a lower side (on the vaporization material 7 side). Such disposition prevents temperature decrease in the release holes 13 and thus avoids clogging of the release holes 13 by the vaporization material 7. The heater 9 and the heating power source 12 will be further described later using FIGS. 3A and 3B.

In addition, a radiation preventive plate 15 is placed around the entire surface of the outer periphery of the heater 9 except a part immediately above the release holes 13. This radiation preventive plate 15 functions to preserve and equalize the heat of the vaporization container 8. Moreover, an outer periphery of the radiation preventive plate 15 is covered by a water-cooling jacket 16 and a heat insulating plate 17. The water-cooling jacket 16 has therein a passage (unillustrated) through which cooling water flows and is cooled by the cooling water. The heat insulating plate 17 has opening portions 17a at positions corresponding to the arrangement positions of the release holes 13 and is in contact with an upper opening portion of the water-cooling jacket 16. The water-cooling jacket 16 and the heat insulating plate 17 functions to prevent heat radiation to the vacuum chamber 1 and the substrate 4. A material having high heat conductivity, such as aluminum, is suitable for the heat insulating plate 17. Note that the opening portions 17a in the heat insulating plate 17 are each formed into a tapered shape becoming wider toward the substrate 4 in order to avoid the vapor of the vaporization material 7 adhering thereto.

Figure 2B:
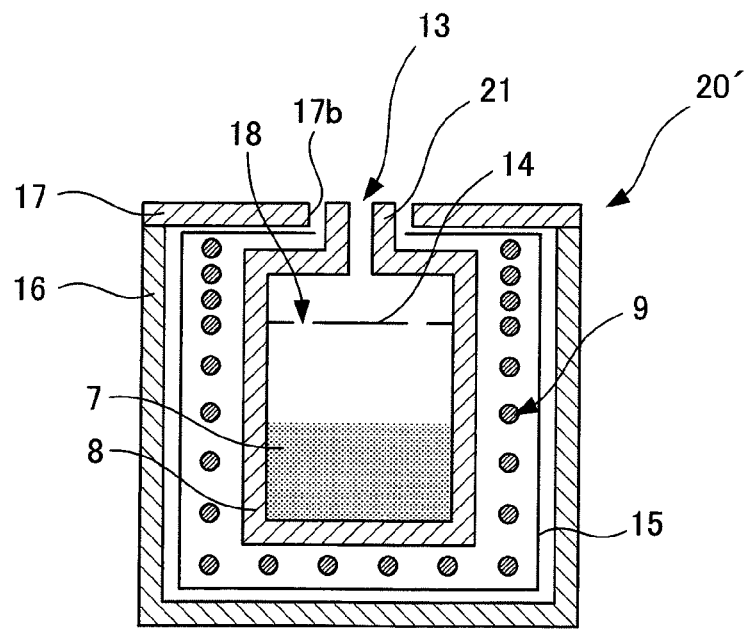

Meanwhile, a vaporization source shown in FIG. 2B is also applicable to the first example. FIG. 2B is a cross-sectional view of the vaporization source as a modification of the first example, taken along a plane perpendicular to the longitudinal direction of the linear-shaped vaporization source. A vaporization source 20' shown in FIG. 2B has approximately the same structure as that of the vaporization source 20 shown in FIG. 2A. However, in this structure, nozzles 21 projecting up to an upper surface of the heat insulating plate 17 are provided to an upper surface (surface on the substrate 4 side) of the vaporization container 8, and the release holes 13 are provided to penetrate through the nozzles 21. With the nozzles 21, the position of the upper plane of each release hole 13 in its height direction is made as high as the position of the upper surface of the heat insulating plate 17 in its height direction. This eliminates a possibility of the vapor of the vaporization material 7 adhering to the heat insulating plate 17. Accordingly, opening portions 17b in the heat insulating plate 17 do not need to be tapered and, instead, are formed to penetrate vertically through the heat insulating plate 17. The other configurations are the same as those of the vaporization source 20 shown in FIG. 2A, and thus the same components in FIG. 2B are denoted by the same reference signs and description thereof will be omitted.

Figure 3A:
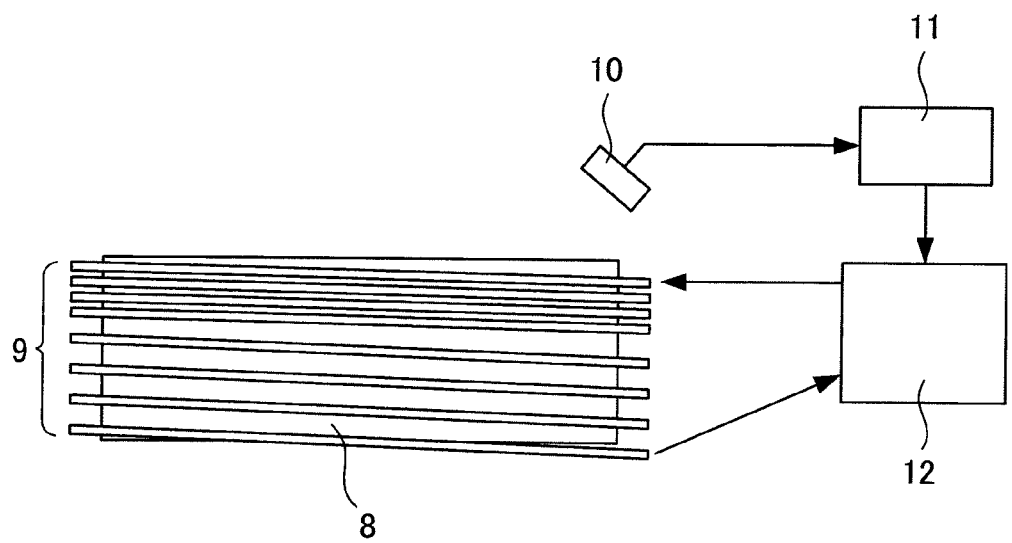
FIG. 3A is a diagram for explaining a configuration of heating means and control means in a vaporization container of the vacuum vapor deposition apparatus according to the present invention.

Next, a configuration of the heating means and the control means in the vaporization container 8 will be described with reference to FIG. 3A. FIG. 3A is a diagram for explaining the configuration of the heating means and the control means of the first example.

The release holes 13 in the vaporization container 8 are exposed to the substrate 4 to be subjected to deposition. Thus, if no countermeasure is taken, the temperature near the release holes 13 become lower than that inside the vaporization container 8. Moreover, when the vaporization container 8 is elongated, a temperature variation is likely to occur in the longitudinal direction. As a countermeasure, described in Patent Literature 1 is a method by which multiple temperature control means are provided separately in the longitudinal direction and vaporization rate control is performed for each separate region. However, in reality, it is extremely difficult to control the temperature on heaters by detecting the vaporization rate for each separate region, and the method requires a complicated structure.

To solve this, in the first example, the heating means to heat the vaporization container 8 is formed by one heating power source 12 and one (single system) heater 9, and the control means therefore is formed by one vaporization rate detector 10 and one vaporization rate controller 11 as shown in FIG. 3A. In this way, the heating means and the control means serves as a single system. The heater 9 is formed of one hot wire wound in spirals around an outer surface of the vaporization container 8. The heater 9 is disposed in such a manner that its pitches would be denser on the release holes 13 side than on the vaporization container 7 side, by winding the heater 9 densely around an upper portion (the release holes 13 side) of the vaporization container 8 and sparsely around a lower portion (the vaporization material 7 side) thereof. Such structure allows single system heat control. Accordingly, it is possible to control the vaporization rate easily and stably over a long period of time, allowing formation of a thin film having a uniform film thickness and thus formation of an element having stable properties.

Figure 3B:
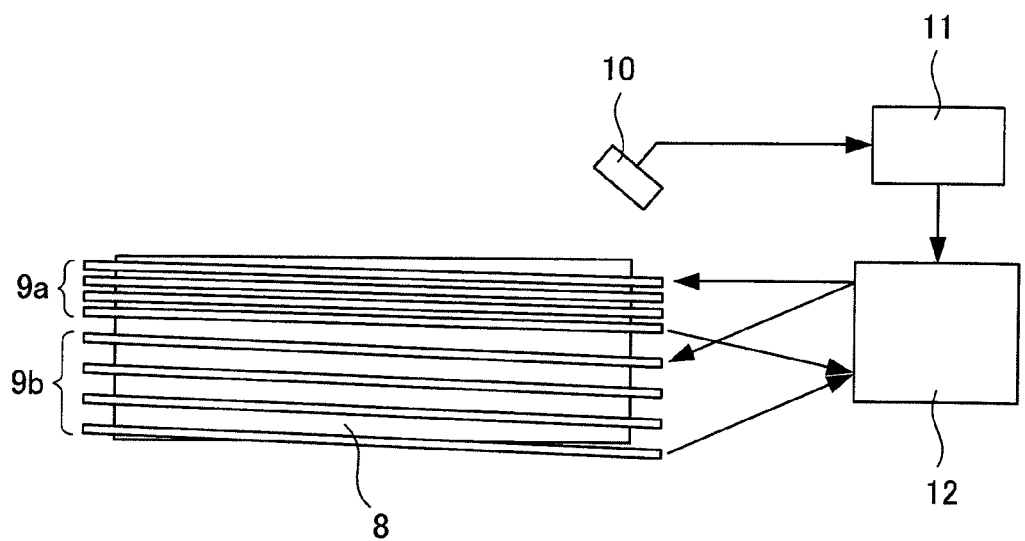
FIG. 3B is a modification of the configuration.

Meanwhile, since the heater 9 is wound around the outer surface of the vaporization container 8 multiple times, one heater may not provide a sufficient output if a required overall length exceeds a usable heater length. In such case, multiple heaters may be used. When multiple heaters are to be used, the heaters are similarly wound around the outer surface of the vaporization container 8. For example, as shown in FIG. 3B, two heaters may be used which are a heater 9a wound densely on an upper portion side and a heater 9b wound sparsely on a lower portion side. In this case, the heaters 9a and 9b are connected to each other in parallel or series, serving as a single system, so that power is fed thereto using one heating power source 12. This structure also allows single system heat control. Accordingly, it is possible to control the vaporization rate easily and stably over a long period of time, allowing formation of a thin film having a uniform film thickness and thus formation of an element having stable properties.

In general, individual heaters differ from each other in resistance even when they have the same length. Thus, using multiple heaters requires different powers. However, by winding the heaters 9a and 9b around the outer surface of the vaporization container 8 for example as shown in FIG. 3b, both heaters 9a and 9b can be disposed in the longitudinal direction of the vaporization container 8. Accordingly, even in the case of using multiple heaters, an influence in heating by the difference between the heaters 9a and 9b does not appear in the longitudinal direction of the vaporization container 8. Hence, the temperature distribution of the vaporization container 8 in its longitudinal direction can be made uniform.

Figure 4A:
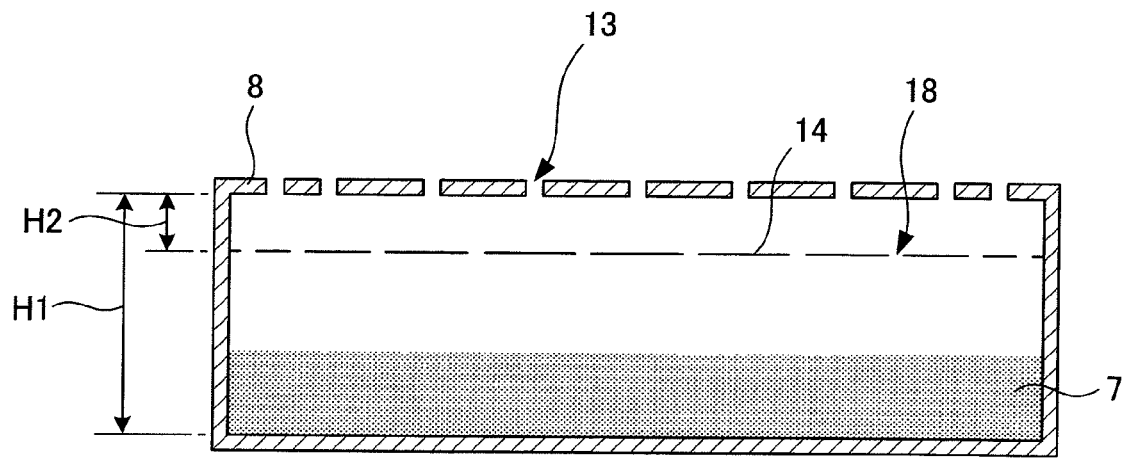
FIGS. 4A to 4C are diagrams showing an example of the structure of the vaporization container of the vacuum vapor deposition apparatus according to the present invention.
Figure 4B:
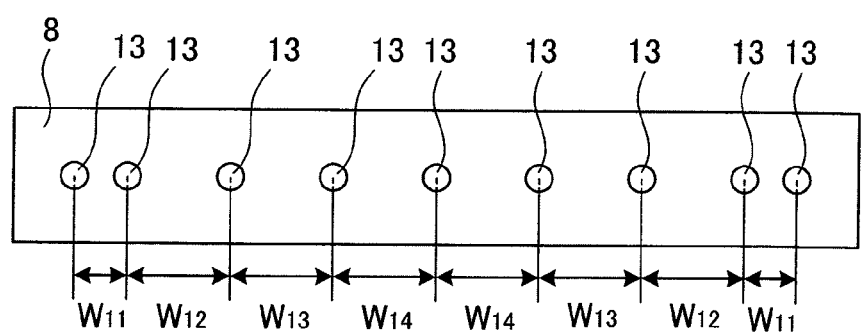
Figure 4C:
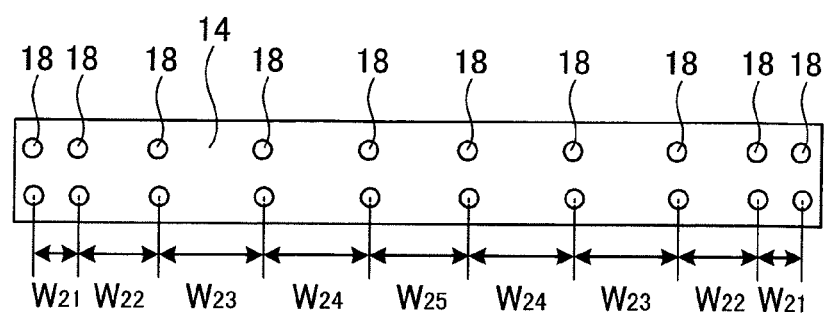

Next, the arrangement of the release holes 13 and the passage holes 18 in the current plate 14 in the first example will be described with reference to FIGS. 4A to 4C. FIG. 4A is a cross-sectional view of the vaporization container 8 in its longitudinal direction. FIG. 4B is a top view of the vaporization container 8. FIG. 4C is a top view of the current plate 14. In the following description, the amount of vapor vaporized from the vaporization material 7 itself will be called a "vaporization amount", whereas the amount of vapor other than that such as the amount of vapor in the release holes 13 and in the passage holes 18 will be called a "vapor amount" to make a clear distinction therebetween.

The multiple release holes 13 are formed in an upper surface (surface on the substrate 4 side) of the vaporization container 8 linearly in the longitudinal direction of the vaporization container 8. All the release holes 13 have a circular shape with the same diameter (with the same area). The release holes 13 are arranged such that the intervals therebetween would be denser toward both end portions from the center of the vaporization container 8 in its longitudinal direction. In this way, conductance by the release hole 13 becomes larger toward both end portions of the vaporization container 8. Assuming that the intervals between the release holes 13 from each end side to the center are $W_{11}$, $W_{12}$, $W_{13}$, and $W_{14}$ in FIG. 4B for example, the intervals $W_{13}$ and $W_{14}$ near the center are equivalent, and the intervals $W_{11}$, $W_{12}$, $W_{13}$, and $W_{14}$ have a relationship of $W_{14} \approx W_{13} > W_{12} > W_{11}$ from the center to each end side.

The vaporization source 20 is a linear-shaped vaporization source. Thus, as for the film thickness distribution on the substrate 4, the film thickness distribution in the board width direction should be taken into consideration. The linear vaporization source 20 may be assumed as what is obtained by arranging many point vaporization sources. For this reason, the thickness distribution, in the board width direction of the substrate 4, of a film formed by the linear vaporization source 20 can be calculated based on geometric superposition of amounts of vapor released from the many point vaporization sources. Using this fact, a vapor amount necessary for each assumptive point vaporization source on the vaporization source 20 is calculated so that the film thickness distribution in the board width direction of the substrate 4 would be uniform. Based on the calculated vapor amounts, conductance on the upper surface of the vaporization container 8 is calculated per unit length. Once conductance is calculated per unit length, conductance of each of the release holes 13 can be calculated based on the diameter and length of the release hole 13 and the average speed of vaporized molecules (see Gorou Tominaga, Hiroo Kumagai, "Shinkuu no Butsuri to Ouyou," Shokabo Publishing Co., Ltd, 1970, or the like for example). Accordingly, the arrangement intervals between the release holes 13 in the longitudinal direction of the vaporization container 8 are calculated.

Calculation of the arrangement intervals of the release holes 13 in the longitudinal direction of the vaporization container 8 indicates as follows. The arrangement intervals between the release holes 13 on both end sides need to be denser than the arrangement intervals between the release holes 13 on the center side (i.e., conductance per unit length needs to be larger on both end sides than on the center side), in order to make the film thickness distribution uniform in the board width direction of the substrate 4. For this reason, in the first example, the intervals have the relationship of $W_{14} \approx W_{13} > W_{12} > W_{11}$ as mentioned above. It should be noted that such arrangement intervals of the release holes 13 are set under the assumption that the vapor amount of the vaporization material 7 immediately below the release holes 13 is uniform. However, in reality, even when each vaporization amount per unit length of the vaporization material 7 itself is uniform, diffusion of the vapor reduces the vapor amounts of the vaporization material 7 on both end sides of the vaporization container 8 immediately below the release holes 13. Thus, even with denser arrangement intervals of the release holes 13 on both end sides (or with larger conductance on both end sides), the vapor amounts on both end sides of the vaporization container 8 are smaller than the estimated amounts. This hinders improvement of the film thickness distribution in the board width direction of the substrate 4.

Moreover, as described above, in a case of an elongated vaporization container 8, a variation in temperature of the vaporization container 8 and/or a change in state of the vaporization material 7 itself may largely vary a vaporization state, which may possibly make the vaporization amount ununiform in the longitudinal direction of the vaporization container 8. Particularly, when the vaporization material 7 is an organic material, state of the material may be changed significantly by a temperature variation. In such case, the vaporization amount becomes ununiform in the longitudinal direction, and, additionally, the vaporization material 7 may be left unevenly along with consumption of the vaporization material 7. This, as a result, makes the vaporization amount even more ununiform in the longitudinal direction.

To solve this, in the first example, the current plate 14 having the passage holes 18 through which the vapor of the vaporization material 7 passes is provided inside the vaporization container 8 so that the vapor amounts of the vaporization material 7 immediately below the release holes 13 are made uniform. With this configuration, it is possible to handle ununiform vaporization amounts of the vaporization material 7 in the longitudinal direction. Hereinafter, the structure of the current plate 14 will be described with reference to FIG. 4C.

The current plate 14 is placed between the release holes 13 and the vaporization material 7 inside the vaporization container 8 so as to separate the release holes 13 side and the vaporization material 7 side. The multiple passage holes 18 are provided to penetrate through the current plate 14 and formed to be aligned in two straight lines extending in the longitudinal direction of the current plate 14. All the passage holes 18 have a circular shape with the same diameter (with the same area). The passage holes 18 are arranged such that the intervals therebetween would be denser toward both end portions from the center of the current plate 14 in its longitudinal direction. In this way, conductance by the passage holes 18 is made proportional to conductance by the release holes 13. Assuming that the intervals between the passage holes 18 from each end side to the center are $W_{21}$, $W_{22}$, $W_{23}$, $W_{24}$, and $W_{25}$ in FIG. 4C for example, the intervals $W_{23}$, $W_{24}$, and $W_{25}$ near the center are mutually equivalent, and the intervals $W_{21}$, $W_{22}$, $W_{23}$, $W_{24}$, and $W_{25}$ have a relationship of $W_{25} \approx W_{24} \approx W_{23} > W_{22} > W_{21}$ from the center to each end side.

The passage holes 18 are arranged such that the release holes 13 and the passage holes 18 are not aligned collinearly when viewed from the entire surface of the vaporization material 7, for the following reason. The vaporization material 7 may be a material that is easy to bump (splash), such as an organic material. When such material bumps, the above arrangement prevents the vapor generated by the bumping from directly passing the passage holes 18 and the release holes 13 to directly adhere to the substrate 4. Since the arrangement prevents vapor generated by bumping from directly adhering to the substrate 4, it is possible to significantly improve a product quality.

It seems that the vapor amounts of the vaporization material 7 immediately below the release holes 13 should become uniform if the passage holes 18 are arranged to have equal intervals therebetween. However, this is also under the assumption that the vapor amounts of the vaporization material 7 below the current plate 14 are uniform. In reality, immediately below the current plate 14, the vapor amounts of the vaporization material 7 on both end sides of the vaporization container 8 decrease as well. Thus, the amounts of vapor passing through the passage holes 18 on both end sides of the current plate 14 are smaller than the estimated amounts. As a result, even with denser arrangement intervals of the release holes 13 on both end sides (or with larger conductance on both end sides), the amounts of vapor passing through the release holes 13 on both end sides of the vaporization container 8 are smaller than the estimated amounts. This hinders improvement of the film thickness distribution in the board width direction of the substrate 4. Moreover, when there is a variation in temperature of the vaporization container 8, a change in state of the vaporization material 7, and/or an unevenness in the vaporization material 7, the vaporization amounts of the vaporization material 7 become ununiform in the longitudinal direction. As a result, the film thickness distribution in the board width direction of the substrate 4 is deteriorated.

Thus, the arrangement intervals between the passage holes 18 are calculated in basically the same way as the arrangement intervals between the release holes 13. For example, a vapor amount necessary for each assumptive point vaporization source on the current plate 14 is calculated so that the vapor amounts immediately below the release holes 13 would be uniform. Based on the calculated vapor amounts, conductance on the upper surface of the current plate 14 is calculated per unit length. Then, based on the calculated conductance per unit length and conductance of each of the passage holes 18, the arrangement intervals between the passage holes 18 in the longitudinal direction of the current plate 14 are calculated. Calculation of the arrangement intervals between the passage holes 18 in the longitudinal direction of the current plate 14 indicates as follows. The arrangement intervals between the passage holes 18 on both end sides need to be denser than the arrangement intervals between the passage holes 18 on the center side (i.e., conductance per unit length needs to be larger on both end sides than on the center side), in order to make uniform the vapor amounts immediately below the release holes 13. For this reason, in the first example, the intervals have the relationship of $W_{25} \approx W_{24} \approx W_{23} > W_{22} > W_{21}$ as mentioned above. Accordingly, the arrangement intervals between the release holes 13 and the arrangement intervals between the passage holes 18 come to have the same arrangement tendency. Thereby, as conductance per unit length in the longitudinal direction, conductance by the passage holes 18 is made proportional to conductance by the release holes 13.

The first example also handles a case where the vaporization amount of the vaporization material 7 itself becomes ununiform in the longitudinal direction. Specifically, the arrangement intervals between the passage holes 18 in the longitudinal direction of the current plate 14 are determined based on conductance per unit length of the vaporization container 8.

To be more precise, assume that conductance by the release holes 13 per unit length of the vaporization container 8 is C1 and conductance by the passage holes 18 per unit length of the current plate 14 is C2. Then, the arrangement intervals between the passage holes 18 are determined based on conductance C2 obtained through calculation allowing a ratio [C2/C1] to be 5.0 or less, or preferably 2.0 or less. Thus, since conductance C1 is large on each end side of the vaporization container 8, conductance C2 is large on each end side of the current plate 14 correlated with conductance C1.

Hereinbelow, the reason for setting the ratio [C2/C1] at 5.0 or less, and preferably 2.0 or less will be described.

Specifically, the optimal range for the ratio [C2/C1] is calculated by performing simulations on how the film thickness distribution varies when changes are made in the ratio [C2/C1] when the vaporization material 7 is present in the vaporization container 8 unevenly on one side. Each value of conductance C1 and C2 is calculated using, as parameters, the hole diameter of the release hole 13, the hole diameter of the passage hole 18, and the like of the vaporization container 8 and the current plate 14 shown in FIGS. 4B and 4C, respectively. Then, the film thickness distribution of a thin film deposited on the substrate 4 is calculated on the basis of vapor amounts corresponding to the calculated values of conductance C1 and C2 (vapor amounts passing through the release hole 13 and the passage hole 18).

Figure 5:
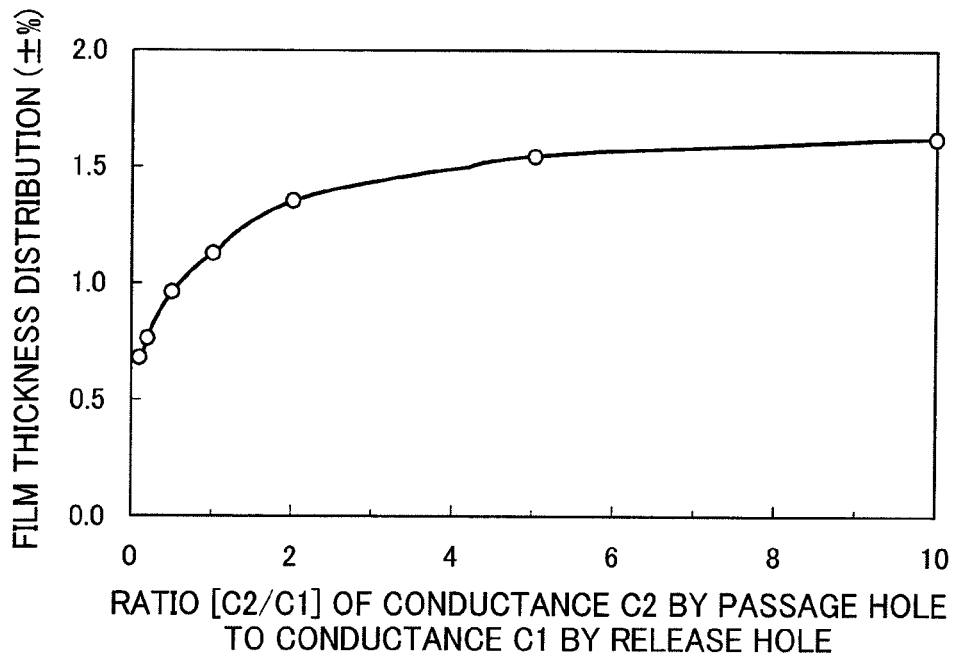
FIG. 5 is a graph showing the relationship between a film thickness distribution and a ratio [C2/C1] of conductance C2 by passage holes to conductance C1 by release holes.

FIG. 5 is a graph showing results of the simulations. FIG. 5 shows that when the conductance ratio [C2/C1] is at 2.0 or less, the film thickness distribution of a thin film is favorable, demonstrating a high rectifying effect on a vapor flow. In contrast, after the conductance ratio [C2/C1] exceeds 5.0, the change in film thickness distribution becomes saturated, indicating a saturation of the rectifying effect. Thus, a more favorable film thickness distribution is obtained as the ratio [C2/C1] becomes smaller. The upper limit of the ratio [C2/C1] is therefore 5.0 or less, and preferably 2.0 or less.

Meanwhile, a small ratio [C2/C1] results in a limited vapor flow and thereby decreases the vaporization rate at which the vaporization material 7 adheres to the substrate 4. Such decrease is disadvantageous to an apparatus requiring high-rate deposition. In this case, the temperature of the heater 9 should be raised to increase the vapor pressure and the vaporization amount of the vaporization material 7 to maintain the vaporization rate.

Figure 6:
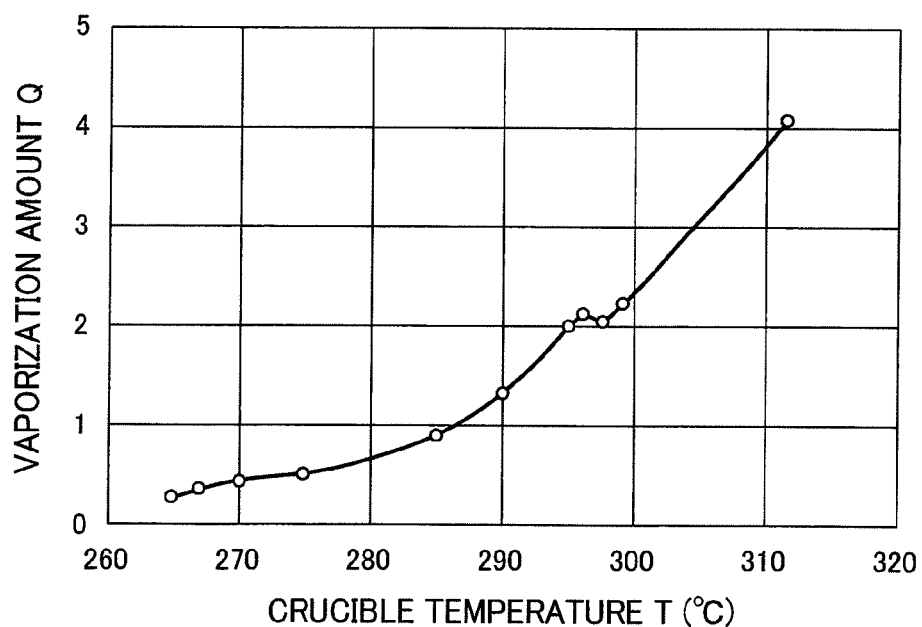
FIG. 6 is a graph regarding measurements on the relationship between a crucible temperature and a vaporization amount (relative value) for Alq3.

FIG. 6 shows results of measurements of the relationship between a crucible temperature T and a vaporization amount Q for tris(8-hydroxyquinolinato) aluminium (Alq3) well-known as a host material of an organic EL as an example. Note that the vaporization amount Q is a relative value that correlates to the vaporization rate. A numerical value of 1 as the relative value corresponds to a vaporization amount at 286° C.

According to the relationship between the crucible temperature T and the vaporization amount Q shown in FIG. 6, the crucible temperature T should be raised by 12° C. to increase the vaporization rate by two times, and likewise, the crucible temperature T should be raised by 30° C. to increase the vaporization rate by five times. It is known that when an organic material used in an organic EL is increased in temperature beyond necessity, heat deterioration occurs in the material and properties of the organic EL luminescent element are degraded. Thus, an appropriate temperature range is set.

Further, for more uniform film thickness distribution in the board width direction of the substrate 4, the position of the current plate 14 in its height direction in the vaporization container 8 should preferably be set as follows.

Specifically, assume that the height of an inside of the vaporization container 8 is H1 and the distance from a lower plane of the release hole 13 to an upper surface of the current plate 14 is H2 (see FIG. 4A described above.) Then, the optimal range for a ratio [H2/H1] is calculated by performing simulations on how the film thickness distribution varies when changes are made in the ratio [H2/H1]. More specifically, changes are made in the ratio [H2/H1] while the ratio [C2/C1]=1.0 in the vaporization container 8 and the current plate 14 shown in FIGS. 4B and 4C. Here, each value of conductance C1 and C2 is also calculated using, as parameters, the hole diameter of the release hole 13, the hole diameter of the passage hole 18, and the like. The film thickness distribution of a thin film deposited on the substrate 4 is calculated on the basis of vapor amounts corresponding to the calculated values of conductance C1 and C2 (vapor amounts passing through the release hole 13 and the passage hole 18). Note that the vaporization material 7 here is also assumed to be present in the vaporization container 8 unevenly on one side.

Figure 7:
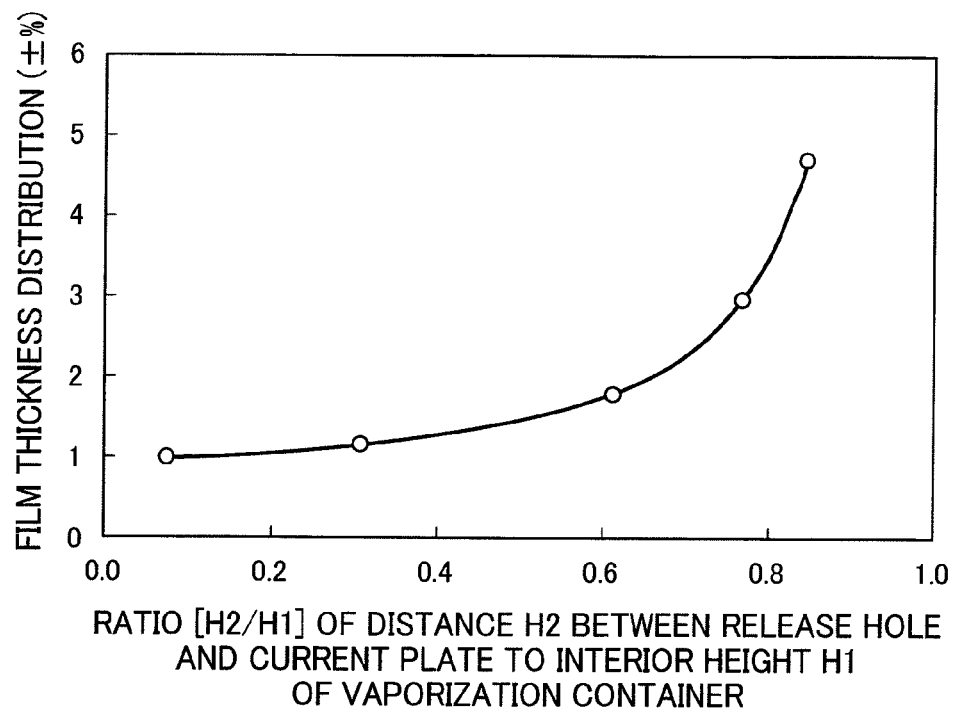
FIG. 7 is a graph showing the relationship between a film thickness distribution and a ratio [H2/H1] of a distance H2 from the release holes to the current plate to a height H1 of an inside of the vaporization container.

FIG. 7 is a graph showing results of the simulations. FIG. 7 shows that after the ratio [H2/H1] exceeds 0.6, the film thickness distribution starts to deteriorate rapidly. In contrast, when the ratio [H2/H1] is 0.6 or less, or desirably 0.5 or less, a more favorable film thickness distribution is achieved. The simulations were examined down to 0.08 as the lower limit. However, even when the ratio [H2/H1] is 0.01, conductance by the release holes 13 is larger, and there is no substantial limit for the ratio to take a smaller value. The ratio [H2/H1] is therefore 0.6 or less, and preferably 0.5 or less.

Figure 8:
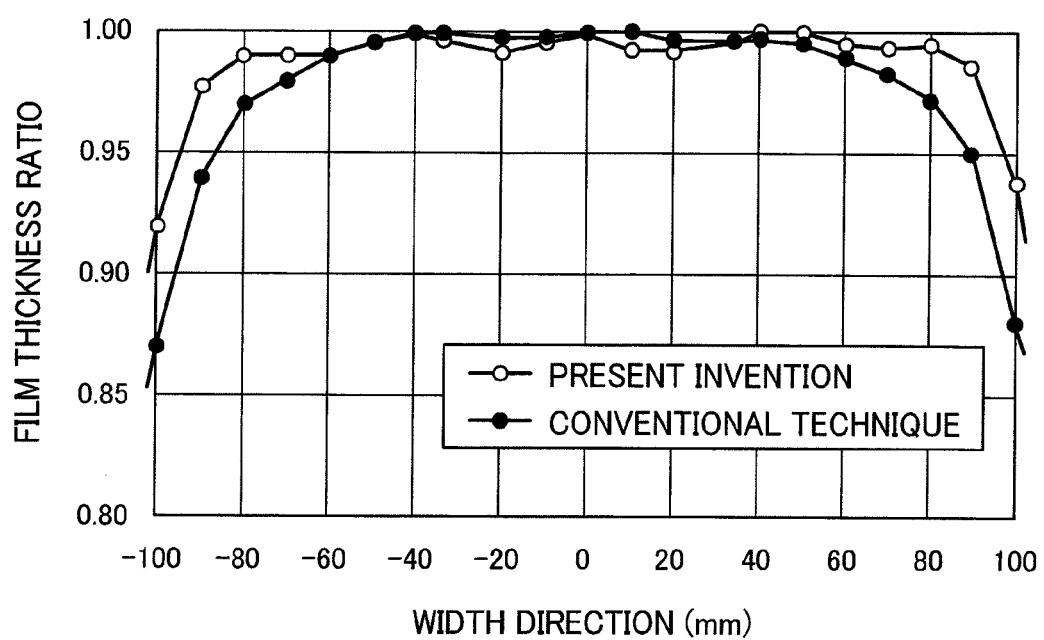
FIG. 8 is a graph showing improvements in film thickness distribution achieved by the vacuum vapor deposition apparatus according to the present invention.
Figure 9:
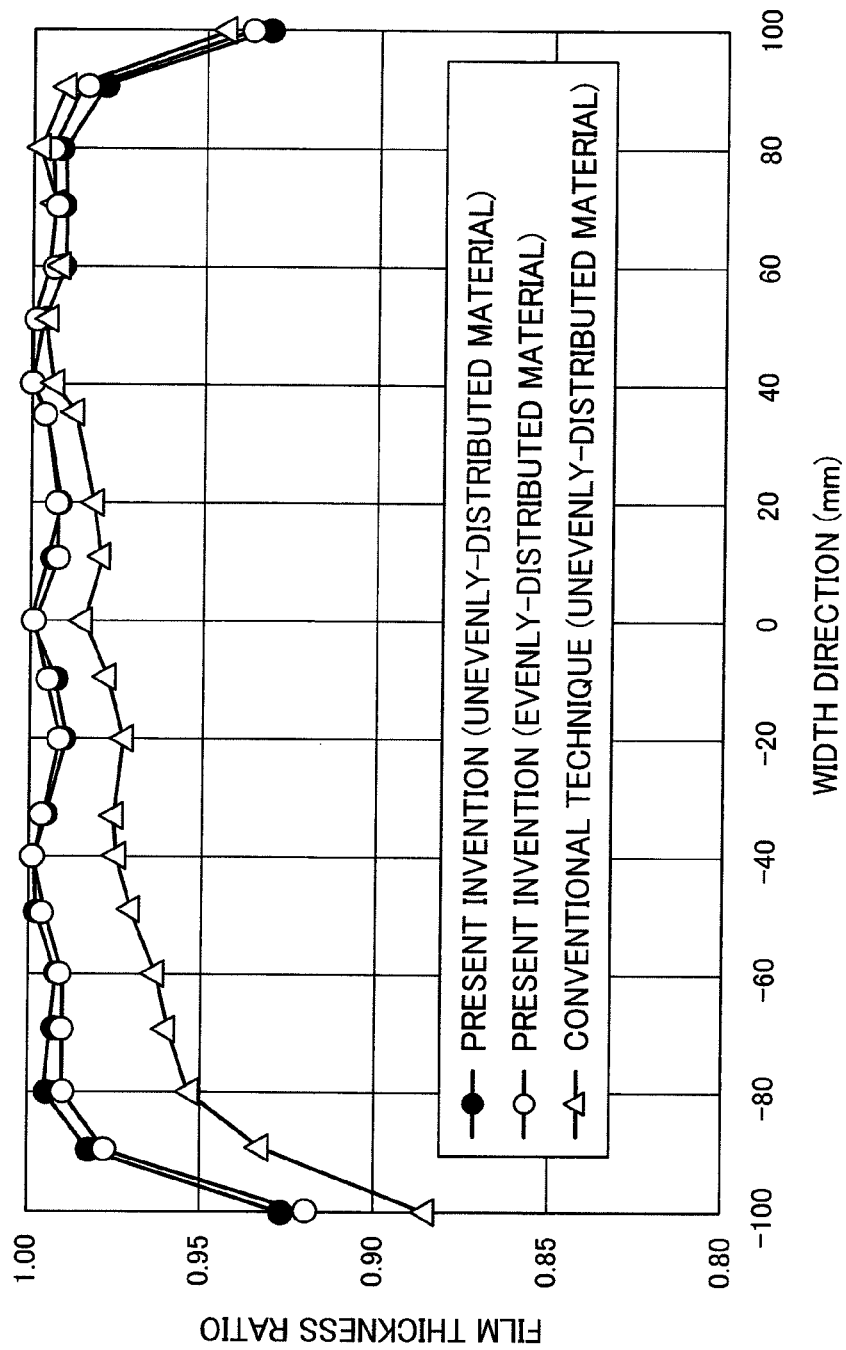
FIG. 9 is a graph showing an effect against an unevenness in a vaporization material brought about by the vacuum vapor deposition apparatus according to the present invention.

Next, results of tests carried out using the vacuum vapor deposition apparatus of the first example are shown in FIGS. 8 and 9 to describe effects of the present invention.

FIG. 8 shows results of measurements on the film thickness distributions of a thin film deposited on a substrate in accordance with a conventional technique (using a vaporization source not including the current plate) and the present invention (using the vaporization source including the current plate). In FIG. 8, what is illustrated in graph for both the conventional technique and the present invention is a ratio of a film thickness to a numerical value of 1 representing the maximum film thickness.

In the graph shown in FIG. 8, in comparison of the film thickness distributions for a width of 180 mm (±90 mm), the uniformity obtained by the conventional technique is ±3.0% whereas the uniformity obtained by the prevent invention is ±1.2%, indicating a large improvement. Thus, a desired result is obtained. Meanwhile, when the effective width for deposition is 160 mm (±80 mm), the uniformity obtained by the prevent invention is within ±1.0%, achieving a significantly uniform film thickness distribution. In recent years, improvement in uniformity of film thickness distribution has been required to improve element properties. The present invention is highly useful for such requirement, since it is capable of satisfying the requirement even when the required uniformity of film thickness distribution is approximately ±1%.

FIG. 9 shows results of measurements on the film thickness distributions of a thin film deposited on a substrate by using a vaporization material in different states of storage, in accordance with the conventional technique (using a vaporization source not including the current plate) and the present invention (using the vaporization source including the current plate). In FIG. 9 too, what is illustrated in graph is a ratio of a film thickness to a numerical value of 1 representing the maximum film thickness.

As the storage states of the vaporization material, used are a case where the vaporization material is filled evenly in an elongated vaporization container (EVENLY-DISTRIBUTED MATERIAL in FIG. 9) and a case where the vaporization material is filled unevenly in one end of the elongated vaporization container (UNEVENLY-DISTRIBUTED MATERIAL in FIG. 9). Here, the vaporization material is filled in an end portion occupying a [100 mm] side of the elongated vaporization container.

As shown in FIG. 9, in the case of the conventional technique, the film thickness gradually decreases to be thinner from the vaporization-material filled side, i.e., from the [100 mm] side to the [−100 mm] side. Thus, the unevenness of the vaporization material is causing unevenness of the film thickness distribution. When the effective width for deposition is at 160 mm (±80 mm), the uniformity obtained by the conventional technique is ±2.5% in film thickness distribution. Such uniformity may be usable for a conventional purpose but falls short of uniformity of a film thickness distribution which has been required recently for a higher quality and precision.

On the other hand, in the case of the present invention, the obtained film thickness distribution with the uneven vaporization material appeared to be approximately identical to that with the even vaporization material. This indicates that a reproducible and stable film thickness distribution can be achieved even when the vaporization material is filled unevenly or left unevenly through consumption of the vaporization material. As a result, the fact that the present invention is able to manufacture a reproducible and stable product is proved.

Hence, the current plate 14 is provided inside the vaporization container 8, and the release holes 13 in the vaporization container 8 and the passage holes 18 in the current plate 14 are arranged to have the positional relationship mentioned above. Accordingly, the vapor amounts immediately below the release holes 13 can be made uniform, which in turn increases the amount of vapor flow on each end side compared to that on the center side. This suppresses a decrease in film thickness at both end portions of the substrate 4 and thus makes uniform the film thickness distribution in the board width direction of the substrate 4. Consequently, a thin film having a desired uniform film thickness distribution can be obtained. Moreover, even when the vaporization material 7 occurs to be present unevenly in the vaporization container 8, the passage holes 18 provided to the current plate 14 uniformize the vapor amounts immediately below the release holes 13. Thereby, the uniformity of the film thickness distribution in the board width direction of the substrate 4 can be maintained without being influenced by unevenness of the vaporization material 7.

Second Example

In the first example, the arrangement intervals of the release holes 13 having the same diameter are changed to alter conductance per unit length in the vaporization container 8. However, as shown in FIG. 10, the arrangement intervals between the release holes 13 may be set at a fixed length, and, instead, the sizes of the release holes 13 may be changed to alter conductance per unit length.

Figure 10:
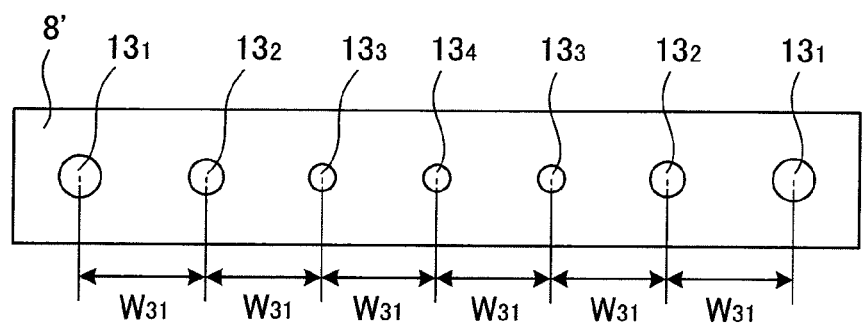
FIG. 10 is a top view showing another example (second example) of the vaporization container of the vacuum vapor deposition apparatus according to the present invention.

Specifically, as shown in FIG. 10, multiple release holes 13 (release holes $13_1$, $13_2$, $13_3$ and $13_4$) are formed in an upper surface (surface on the substrate 4 side) of a vaporization container 8' so as to be arranged in a straight line in the longitudinal direction of the vaporization container 8'. The arrangement intervals between the release holes 13 are all set to the same interval $W_{31}$, but the circular opening diameters thereof are made different. Specifically, for a uniform film thickness distribution on the substrate 4, the opening diameters (areas) of the release holes $13_1$ on both end portion sides are made larger than that of the release hole $13_4$ at the center in the longitudinal direction of the vaporization container 8'. Thus, conductance by the release holes 13 at both end portion sides is made larger. Assuming that the opening diameters of the release holes $13_1$, $13_2$, $13_3$, and $13_4$ are for example $D_{31}$, $D_{32}$, $D_{33}$, and $D_{34}$ in FIG. 10, respectively, the opening diameters $D_{33}$ and $D_{34}$ of the release holes $13_3$ and $13_4$ near the center are equivalent, and the opening diameters $D_{31}$, $D_{32}$, $D_{33}$, and $D_{34}$ have a relationship of $D_{34} \approx D_{33} < D_{32} < D_{31}$ from the center to each end side.

Suppose a case where instead of the vaporization container 8 shown in FIG. 4B, the vaporization container 8' is used in combination with the current plate 14 shown in FIG. 4C to serve as a linear-shaped vaporization source. In this case, similar to the first example, the arrangement intervals of the passage holes 18 in the current plate 14 are set in such a manner that a ratio {C2/C1} would be 5.0 or less, and preferably 2.0 or less, where C1 is conductance by the release holes 13 per unit length of the vaporization container 8' and C2 is conductance by the passage holes 18 per unit length of the current plate 14. Moreover, similar to the first example, the current plate 14 is also placed in such a manner that a ratio [H2/H1] would be 0.6 or less, and preferably 0.5 or less, where H1 is the height of an inside of the vaporization container 8' and H2 is the distance from the lower plane of the release hole 13 to the upper surface of the current plate 14.

Third Example

In the first example, the arrangement intervals of the passage holes 18 having the same diameter are changed to alter conductance per unit length for the current plate 14. However, as shown in FIG. 11, the arrangement intervals between the passage holes 18 may be set at a fixed length, and, instead, the sizes of the passage holes 18 may be changed to alter conductance per unit length.

Figure 11:
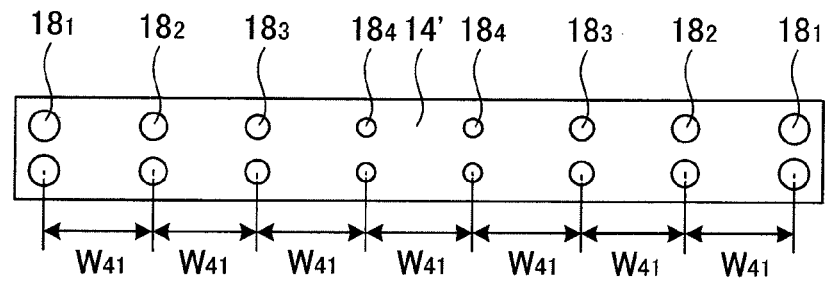
FIG. 11 is a top view showing another example (third example) of the current plate of the vaporization container of the vacuum vapor deposition apparatus according to the present invention.

Specifically, as shown in FIG. 11, multiple passage holes 18 (passage holes $18_1$, $18_2$, $18_3$ and $18_4$) are formed in a current plate 14' so as to be arranged in two straight lines in the longitudinal direction of the current plate 14'. The arrangement intervals between the passage holes 18 are all set to the same interval $W_{41}$, but the circular opening diameters thereof are made different. Specifically, for uniform vapor amounts immediately below the release holes 13, the opening diameters (areas) of the passage holes $18_1$ on both end portion sides are made larger than those of the passage holes $18_4$ at the center in the longitudinal direction of the current plate 14'. Thus, conductance by the passage holes 18 is made proportional to conductance by the release holes 13. Assuming that the opening diameters of the passage holes $18_1$, $18_2$, $18_3$ and $18_4$ are for example $D_{41}$, $D_{42}$, $D_{43}$, and $D_{44}$ in FIG. 11, respectively, the opening diameters $D_{43}$ and $D_{44}$ of the passage holes $18_3$ and $18_4$ near the center are equivalent, and the opening diameters $D_{41}$, $D_{42}$, $D_{43}$, and $D_{44}$ have a relationship of $D_{44} \approx D_{43} < D_{42} < D_{41}$ from the center to each end side.

Suppose a case where instead of the current plate 14 shown in FIG. 4C, the Current plate 14' is used in combination with the vaporization container 8 shown in FIG. 4B to serve as a linear-shaped vaporization source. In this case, similar to the first example, the opening diameters of the passage holes 18 in the current plate 14' are set in such a manner that a ratio [C2/C1] would be 5.0 or less, and preferably 2.0 or less, where C1 is conductance by the release holes 13 per unit length of the vaporization container 8 and C2 is conductance by the passage holes 18 per unit length of the current plate 14'. Moreover, similar to the first example, the current plate 14' is also placed in such a manner that a ratio [H2/H1] would be 0.6 or less, and preferably 0.5 or less, where H1 is the height of an inside of the vaporization container 8 and H2 is the distance from the lower plane of the release hole 13 to the upper surface of the current plate 14'.

Further, suppose a case where instead of the vaporization container 8 shown in FIG. 4B and also the current plate 14 shown in FIG. 4C, the vaporization container 8' shown in FIG. 10 in the second example is used in combination with the current plate 14' to serve as a linear-shaped vaporization source. In this case, similar to the first example, the opening diameters of the passage holes 18 in the current plate 14' are set in such a manner that a ratio [C2/C1] would be 5.0 or less, and preferably 2.0 or less, where C1 is conductance by the release holes 13 per unit length of the vaporization container 8' and C2 is conductance by the passage holes 18 per unit length of the current plate 14'. Moreover, similar to the first example, the current plate 14' is also placed in such a manner that a ratio [H2/H1] would be 0.6 or less, and preferably 0.5 or less, where H1 is the height of an inside of the vaporization container 8' and H2 is the distance from the lower plane of the release hole 13 to the upper surface of the current plate 14'.

When the vaporization container 8' shown in FIG. 10 is used in combination with the current plate 14' shown in FIG. 11, particularly when $W_{31} = W_{41}$, the opening diameters of the passage holes 18 in the current plate 14' may be set in such a manner that a ratio [Cb/Ca] of conductance Ca of the release hole 13 and conductance Cb of its corresponding passage hole 18, instead of the ratio of conductance per unit length, would be 5.0 or less, and preferably 2.0 or less.

Note that in the first to third examples the release holes 13 and the passage holes 18 each have a circular shape, but may have a square shape, an elliptic shape, a rectangular shape, or the like. Furthermore, one release hole 13 is associated with two passage holes 18 but may be associated with one or otherwise many (3 or more) passage holes 18.

INDUSTRIAL APPLICABILITY

A vacuum vapor deposition apparatus according to the present invention is suitable particularly for a case where the deposition target is a large substrate, and also suitable for a case where the vaporization materials are organic materials.

REFERENCE SIGNS LIST

1 VACUUM CHAMBER
2 VALVE
3 VACUUM PUMP
4 SUBSTRATE
5 DRIVE SOURCE
6 TRANSPORT ROLLER
7 VAPORIZATION MATERIAL
8 VAPORIZATION CONTAINER
9 HEATER
10 VAPORIZATION RATE DETECTOR
11 VAPORIZATION RATE CONTROLLER
12 HEATING POWER SOURCE
13 RELEASE HOLE
14 CURRENT PLATE
15 RADIATION PREVENTIVE PLATE
16 WATER-COOLING JACKET
17 HEAT INSULATING PLATE
18 PASSAGE HOLE

The invention claimed is:

1. A vacuum vapor deposition apparatus comprising:
a vaporization container that has a plurality of release holes arranged linearly in an arrangement direction in only one line such that a conductance by the release holes on both end portion sides of the vaporization container is larger than at the center of the vaporization container, wherein the vaporization container is one container containing a vaporization material on one bottom thereof for the plurality of release holes and the vaporization container is configured to be heated so as to evaporate or sublimate the vaporization material such that vapor of the vaporization material is released through the plurality of release holes, and wherein the vaporization material is to be deposited on an entire surface of a substrate by relatively moving the substrate and the vaporization container in a direction perpendicular to the arrangement direction of the plurality of release holes; and
a current plate fixed in the vaporization container so as to directly face the vaporization material, the current plate having a plurality of passage holes through which the vapor passes, the passage holes being arranged on both sides of the line of the release holes when viewed from the top of the vaporization container, and as conductance per unit length in the arrangement direction of the plurality of release holes, conductance by the passage holes is made proportional to conductance by the release holes along the arrangement direction, wherein both the conductance by the release holes and the conductance by the passage holes are increasingly larger from the center of the vaporization container to each end portion side of the vaporization container.

2. The vacuum vapor deposition apparatus according to claim 1, wherein
the conductance by the release holes is increasingly larger from the center of the vaporization container to each end portion side of the vaporization container by all the release holes having an equal area and by the release holes being arranged increasingly more densely from the center of the vaporization container to each end portion side of the vaporization container, or by the plurality of release holes being arranged at equal intervals and by the release holes having increasingly larger areas from the center of the vaporization container to each end portion side of the vaporization chamber.

3. The vacuum vapor deposition apparatus according to claim 1, wherein
the conductance by the passage holes is proportional to the conductance of the release holes by all the passage holes having an equal area and by the passage holes being arranged increasingly more densely from the center of the current plate to each end portion side of the current plate, or by the plurality of passage holes being arranged at equal intervals and by the passage holes having increasingly larger areas from the center of the current plate to each end portion side of the current plate.

4. The vacuum vapor deposition apparatus according to claim 1, wherein
a ratio C2/C1 of conductance C2 by the passage holes to conductance C1 by the release holes is set at 5.0 or less.

5. The vacuum vapor deposition apparatus according to claim 4, wherein
the ratio C2/C1 of conductance C2 by the passage holes to conductance C1 by the release holes is set at 2.0 or less.

6. The vacuum vapor deposition apparatus according to claim 1, wherein
a ratio H2/H1 of a distance H2 from the release holes to the current plate to a height H1 of an inside of the vaporization container is set at 0.6 or less.

7. The vacuum vapor deposition apparatus according to claim 6, wherein
the ratio H2/H1 of the distance H2 from the release holes to the current plate to the height H1 of the inside of the vaporization container is set at 0.5 or less.

8. The vacuum vapor deposition apparatus according to claim 1, wherein
the passage holes are arranged in such a manner that the release holes and the passage holes are not aligned colinearly when viewed from the entire surface of the vaporization material.

9. The vacuum vapor deposition apparatus according to claim 1, further comprising:
a heater wound in spirals around an outer surface of the vaporization container;
a heating power source which supplies the heater with power;
a vaporization rate detector which detects a vaporization rate of the vapor of the vaporization material; and
a vaporization rate controller which controls an output to the heating power source on the basis of the vaporization rate detected by the vaporization rate detector, so that the vaporization rate of the vapor of the vaporization material remains constant.

10. The vacuum vapor deposition apparatus according to claim 9, wherein
the heater is wound in such a manner that intervals thereof on a release holes side of the vaporization container are denser than intervals thereof on a vaporization material side of the vaporization container.

* * * * *